US008921024B2

(12) United States Patent
Wu et al.

(10) Patent No.: US 8,921,024 B2
(45) Date of Patent: Dec. 30, 2014

(54) PHOTOSENSITIVE POLYSILOXANE COMPOSITION AND APPLICATIONS THEREOF

(71) Applicant: Chi Mei Corporation, Tainan (TW)

(72) Inventors: Ming-Ju Wu, Tainan (TW); Chun-An Shih, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 14/098,763

(22) Filed: Dec. 6, 2013

(65) Prior Publication Data

US 2014/0178819 A1 Jun. 26, 2014

(30) Foreign Application Priority Data

Dec. 20, 2012 (TW) ............................ 101148690 A

(51) Int. Cl.

| | |
|---|---|
| ***G03F 7/023*** | (2006.01) |
| ***G03F 7/027*** | (2006.01) |
| ***G03F 7/075*** | (2006.01) |
| ***G03F 7/038*** | (2006.01) |

(52) U.S. Cl.

CPC .................................... *G03F 7/038* (2013.01)
USPC ........... 430/165; 430/191; 430/192; 430/193

(58) Field of Classification Search

CPC ...... G03F 7/0233; G03F 7/027; G03F 7/0752
USPC ................................ 430/165, 191, 192, 193
See application file for complete search history.

(56) References Cited

U.S. PATENT DOCUMENTS

| | | | | |
|---|---|---|---|---|
| 6,534,235 | B1 * | 3/2003 | Hanabata et al. | 430/191 |
| 7,115,673 | B2 * | 10/2006 | Mochizuki et al. | 522/164 |

FOREIGN PATENT DOCUMENTS

| | | |
|---|---|---|
| JP | 2003-315998 | 11/2003 |
| TW | 200912544 | 3/2009 |

OTHER PUBLICATIONS

"Office Action of Taiwan Counterpart Application", issued on Sep. 25, 2014, pp. 1-3.

* cited by examiner

*Primary Examiner* — John Chu
(74) *Attorney, Agent, or Firm* — Jianq Chyun IP Office

(57) ABSTRACT

A photosensitive polysiloxane composition for forming a protective film having superior sensitivity is disclosed. A protective film formed from the photosensitive polysiloxane composition and an element including the protective film are also disclosed. The photosensitive polysiloxane composition includes a polysiloxane, an o-naphthoquinonediazidesulfonic acid ester, a urethane(meth)acrylate compound having at least six (meth)acryloyl groups in a molecule, and a solvent.

7 Claims, No Drawings

PHOTOSENSITIVE POLYSILOXANE COMPOSITION AND APPLICATIONS THEREOF

CROSS-REFERENCE TO RELATED APPLICATION

This application claims priority of Taiwanese Application No. 101148690, filed on Dec. 20, 2012.

BACKGROUND OF THE INVENTION

1. Field of the Invention

This invention relates to a photosensitive polysiloxane composition, more particularly to a positive photosensitive polysiloxane composition including a polysiloxane and a urethane (meth)acrylate compound having at least six (meth) acryloyl groups in a molecule. This invention also relates to a protective film formed from the photosensitive polysiloxane composition, and an element containing the protective film.

2. Description of the Related Art

In recent years, in the field of semiconductor industry, liquid crystal displays, and organic electroluminescence displays, it is required that the pattern details in photolithography process be higher due to element miniaturization.

Positive type photosensitive materials with high resolution and high sensitivity are adopted to obtain miniaturized patterns via exposure and development. The positive type photosensitive material containing a polysiloxane composition has been widely used in the art.

JP 2008-107529 discloses a photosensitive resin composition capable of forming a cured film. The photosensitive resin composition includes a polysiloxane, a quinonediazidesulfonic acid ester, and a solvent. The polysiloxane contains an oxetanyl group or a succinic anhydride group, and is obtained by subjecting a silane monomer containing an oxetanyl group or a succinic anhydride group to hydrolysis and partial condensation. The polysiloxane is formed with a hydrophilic structure via a ring-opening reaction during copolymerization, and thus has high dissolution in a dilute alkali developer. However, the sensitivity of the photosensitive resin composition is inferior and is not acceptable in the art.

It is still required in the art to provide a photosensitive resin composition which can be used to form a protective film having superior sensitivity which is acceptable in the art.

SUMMARY OF THE INVENTION

A first object of this invention is to provide a photosensitive polysiloxane composition for forming a protective film having superior sensitivity.

A second object of this invention is to provide the protective film having superior sensitivity.

A third object of this invention is to provide an element having the protective film.

According to a first aspect of this invention, there is provided a photosensitive polysiloxane composition including a polysiloxane, an o-naphthoquinonediazidesulfonic acid ester, a urethane (meth)acrylate compound having at least six (meth)acryloyl groups in a molecule, and a solvent.

According to a second aspect of this invention, there is provided a protective film formed by applying the photosensitive polysiloxane composition on a substrate.

According to a third aspect of this invention, there is provided an element including a substrate, and the protective film applied on the substrate.

DETAILED DESCRIPTION OF THE PREFERRED EMBODIMENTS

As used herein, the term "(meth)acrylic acid" means acrylic acid and/or methacrylic acid, the term "(meth)acryloyl" means acryloyl and/or methacryloyl, and the term "(meth)acrylate" means acrylate and/or methacrylate.

A photosensitive polysiloxane composition of the present invention includes a polysiloxane, an o-naphthoquinonediazidesulfonic acid ester, a urethane (meth)acrylate compound having at least six (meth)acryloyl groups in a molecule, and a solvent.

Polysiloxane:

There is no specific limitation to the polysiloxane suitable for the present invention as long as the object of the present invention can be achieved. Preferably, the polysiloxane is obtained by subjecting a silane monomer, a siloxane prepolymer, or a combination thereof to hydrolysis and partial condensation.

Preferably, the polysiloxane is obtained by subjecting a silane monomer of Formula (I) to hydrolysis and partial condensation:

$$Si(R^a)_t(OR^b)_{4-t} \quad (I)$$

where t denotes an integer ranging from 0 to 3, $R^a$ independently represents hydrogen, a $C_1$-$C_{10}$ alkyl group, a $C_2$-$C_{10}$ alkenyl group, a $C_6$-$C_{15}$ aryl group, an anhydride-substituted $C_1$-$C_{10}$ alkyl group, an epoxy-substituted $C_1$-$C_{10}$ alkyl group, or an epoxy-substituted oxyalkyl group, and $R^b$ independently represents hydrogen, a $C_1$-$C_6$ alkyl group, a $C_1$-$C_6$ acyl group, or a $C_6$-$C_{15}$ aryl group.

In the definition of $R^a$, examples of the $C_1$-$C_{10}$ alkyl group include, but are not limited to, methyl, ethyl, n-propyl, isopropyl, n-butyl, tert-butyl, n-hexyl, n-decyl, trifluoromethyl, 3,3,3-trifluoropropyl, 3-aminopropyl, 3-mercaptopropyl, and 3-isocyanatopropyl. Examples of the $C_2$-$C_{10}$ alkenyl group include, but are not limited to, vinyl, 3-acryloxypropyl, and 3-methacryloxypropyl. Examples of the $C_6$-$C_{15}$ aryl group include, but are not limited to, phenyl, tolyl, p-hydroxyphenyl, 1-(p-hydroxyphenyl)ethyl, 2-(p-hydroxyphenyl)ethyl, 4-hydroxy-5-(p-hydroxyphenylcarbonyloxy)pentyl, and naphthyl.

Examples of the anhydride-substituted $C_1$-$C_{10}$ alkyl group include, but are not limited to, ethyl succinic anhydride, propyl succinic anhydride, and propyl glutaric anhydride.

Examples of the epoxy-substituted $C_1$-$C_{10}$ alkyl group include, but are not limited to, oxetanylpentyl and 2-(3,4-epoxycyclohexyl)ethyl.

Examples of the epoxy-substituted oxyalkyl group include, but are not limited to, glycidoxypropyl and 2-oxetanylbutoxy.

In the definition of $R^b$, examples of the $C_1$-$C_6$ alkyl group include, but are not limited to, methyl, ethyl, n-propyl, isopropyl, and n-butyl. A non-limiting example of the $C_1$-$C_6$ acyl group is acetyl. A non-limiting example of the $C_6$-$C_{15}$ aryl group is phenyl.

In Formula (I), when t denotes 0, the silane monomer represents a tetrafunctional silane, when t denotes 1, the silane monomer represents a trifunctional silane, when t denotes 2, the silane monomer represents a difunctional silane, and when t denotes 3, the silane monomer represents a monofunctional silane.

Examples of the silane monomer include, but are not limited to, (1) tetrafunctional silane: tetramethoxysilane, tetraethoxysilane, tetraacetoxysilane, tetraphenoxy silane, or the like; (2) trifunctional silane:methyltrimethoxysilane (MTMS), methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-prop yltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, acryoyloxypropyltrimethoxysilane, 3-methylacryloyloxypropyltrimethoxysilane, 3-methylacryloyloxypropyltriethoxysilane, phenyltrimethoxysilane (PTMS), phenyltriethoxysilane (PTES), p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, 3-ethyl-3-[[3-(triphenoxysilyl)propoxy)methyl]oxetane, commercially available 3-ethyl-3-[[3-(trimethoxysilyl)propoxy)methyl]oxetane manufactured by Toagosei (trade name: TMSOX-D), 3-ethyl-3-[[3-(triethoxysilyl)propoxy)methyl]oxetane manufactured by Toagosei (trade name: TESOX-D), 2-(trimethoxysilyl)ethyl succinic anhydride, 3-triphenoxysilyl propyl succinic anhydride, commercially available 3-trimethoxysilyl propyl succinic anhydride manufactured by Shin-Etsu (trade name: X-12-967), commercially available 3-(triethoxysilyl)propyl succinic anhydride manufactured by WACKER (trade name: GF-20), 3-(trimethoxysilyl)propyl glutaric anhydride (TMSG), 3-(triethoxysilyl)propyl glutaric anhydride, 3-(triphenoxysilyl)propyl glutaric anhydride, or the like; (3) difunctional silane: dimethyldimethoxysilane (DMDMS), dimethyldiethoxysilane, dimethyldiacetyloxysilane, di-n-butyldimethoxysilane, diphenyldimethoxysilane, diisopropoxy-di(2-oxetanylbutoxypropyl)silane (DIDOS), di(3-oxetanylpentyl)dimethoxy silane, (di-n-butoxysilyl) di(propyl succinic anhydride), (dimethoxysilyl) di(ethyl succinic anhydride), or the like; (4) monofunctional silane: trimethylmethoxysilane, tri-n-butylethoxysilane, 3-glycidoxypropyldimethylmethoxysilane, 3-glycidoxypropyldimethylethoxysilane, di(2-oxetanylbutoxypentyl)-2-oxetanylpentylethoxy silane, tri(2-oxetanylpentyl)methoxy silane, (phenoxysilyl) tri(propyl succinic anhydride), (methoxysilyl) di(ethyl succinic anhydride), or the like. The aforesaid examples of the silane monomer can be used alone or as a mixture of two or more.

Preferably, the siloxane prepolymer is represented by Formula (I-2):

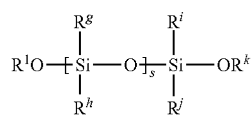

(I-2)

where $R^g$, $R^h$, $R^i$ and $R^j$ independently represent a hydrogen atom, a substituted or unsubstituted $C_1$-$C_{10}$ alkyl group, a substituted or unsubstituted $C_2$-$C_6$ alkenyl group, or a substituted or unsubstituted $C_6$-$C_{15}$ aryl group. The plural $R^g$s can be identical with or different from each other and the plural $R^h$s can be identical with or different from each other when s ranges from 2 to 1,000. Examples of the alkyl group include, but are not limited to, methyl, ethyl, and n-propyl. Examples of the alkenyl group include, but are not limited to, vinyl, acryloxypropyl, and methacryloxypropyl. Examples of the aryl group include, but are not limited to, phenyl, tolyl, and naphthyl.

$R^l$ and $R^k$ independently represent a hydrogen atom, a substituted or unsubstituted $C_1$-$C_6$ alkyl group, a substituted or unsubstituted $C_1$-$C_6$ acyl group, or a substituted or unsubstituted $C_6$-$C_{15}$ aryl group. Examples of the alkyl group include, but are not limited to, methyl, ethyl, n-propyl, isopropyl, and n-butyl. A non-limiting example of the acyl group is acetyl. A non-limiting example of the aryl group is phenyl.

In Formula (I-2), s is an integer ranging from 1 to 1,000, preferably from 3 to 300, and more preferably from 5 to 200.

Examples of the siloxane prepolymer represented by formula (I-2) include, but are not limited to, 1,1,3,3-tetramethyl-1,3-dimethoxy disiloxane, 1,1,3,3-tetramethyl-1,3-diethoxydisiloxane, 1,1,3,3-tetraethyl-1,3-diethoxydisiloxane, and commercially available silanol terminal polysiloxanes manufactured by Gelest Inc. (for example, DM-S12 (molecular weight: 400-700), DMS-S15 (molecular weight: 1,500-2,000), DMS-S21 (molecular weight: 4,200), DMS-S27 (molecular weight: 18,000), DMS-S31 (molecular weight: 26,000), DMS-S32 (molecular weight: 36,000), DMS-S33 (molecular weight: 43,500), DMS-S35 (molecular weight: 49,000), DMS-S38 (molecular weight: 58,000), DMS-S42 (molecular weight: 77,000), PDS-9931 (molecular weight: 1,000-1,400), and the like). The aforesaid examples of the siloxane prepolymer can be used alone or as a mixture of two or more.

When the silane monomer and the siloxane prepolymer are used in combination, there is no specific limitation to the mixing ratio thereof. Preferably, the molar ratio of the silane monomer and the siloxane prepolymer in Si atom ranges from 100:0.01 to 50:50.

Alternatively, polysiloxane can be prepared via copolymerization by mixing the silane monomer and/or siloxane prepolymer with silicon dioxide particles. There is no specific limitation to the mean particle size of the silicon dioxide particles. The mean particle size of the silicon dioxide particles ranges generally from 2 nm to 250 nm, preferably from 5 nm to 200 nm, and more preferably from 10 nm to 100 nm.

Examples of the silicon dioxide particles include, but are not limited to, commercially available products manufactured by JGC Catalysts and Chemicals Ltd., for example, OSCAR 1132 (particle size: 12 nm, dispersant: methanol), OSCAR 1332 (particle size: 12 nm, dispersant: n-propanol), OSCAR 105 (particle size: 60 nm, dispersant: γ-butyrolactone), OSCAR 106 (particle size: 120 nm, dispersant: diacetone alcohol), and the like; commercially available products manufactured by Fuso Chemical Co., Ltd., for example, Quartron PL-1-IPA (particle size: 13 nm, dispersant: isopropanone), Quartron PL-1-TOL (particle size: 13 nm, dispersant: toluene), Quartron PL-2L-PGME (particle size: 18 nm, dispersant: propylene glycol monomethyl ether), Quartron PL-2L-MEK (particle size: 18 nm, dispersant: methyl ethyl ketone), and the like; and commercially available products manufactured by Nissan Chemical, for example, IPA-ST (particle size: 12 nm, dispersant: isopropanol), EG-ST (particle size: 12 nm, dispersant: ethylene glycol), IPA-ST-L (particle size: 45 nm, dispersant: isopropanol), IPA-ST-ZL (particle size: 100 nm, dispersant: isopropanol), and the like. The aforesaid examples of the silicon dioxide particles can be used alone or as a mixture of two or more.

There is no specific limitation to the amounts when mixing the silicon dioxide particles with the silane monomer and/or the siloxane prepolymer. Preferably, the molar ratio of the silicon dioxide particles to the polysiloxane in Si atom ranges from 1:100 to 50:100.

The hydrolysis and the partial condensation can be conducted in a manner well known in the art. For example, a solvent, water, and optionally a catalyst are added to the mixture of the silane monomer and/or the siloxane prepolymer and/or the silicon dioxide particles, followed by stirring at a temperature ranging from 50 to 150° C. for 0.5 to 120 hours. During stirring, the by-products, such as alcohols and water, can be removed by distillation if necessary.

There is no specific limitation to the solvent, which can be identical with or different from the solvent contained in the photosensitive polysiloxane composition. Preferably, the solvent is used in an amount ranging generally from 15 g to 1200 g, preferably from 20 g to 1100 g, and more preferably from 30 g to 1000 g based on 100 g of the silane monomer and/or the siloxane prepolymer.

The amount of water for the hydrolysis ranges from 0.5 to 2 moles based on 1 mole of the hydrolyzable groups contained in the mixture.

There is no specific limitation to the catalyst, and an acid catalyst or a base catalyst can be preferably used. Examples of the acid catalyst include hydrochloric acid, nitric acid, sulfuric acid, hydrofluoric acid, oxalic acid, phosphoric acid, acetic acid, trifluoroacetic acid, formic acid, polycarboxylic acids and anhydrides thereof, ion exchange resins, or the like. Examples of the base catalyst include diethylamine, triethylamine, tripropylamine, tributylamine, tripentylamine, trihexylamine, triheptylamine, trioctylamine, diethanolamine, triethanolamine, sodium hydroxide, potassium hydroxide, alkoxysilanes containing an amino group, ion exchange resins, or the like.

Preferably, the catalyst is used in an amount ranging generally from 0.005 g to 15 g, preferably from 0.01 g to 12 g, and more preferably from 0.05 g to 10 g, based on 100 g of the silane monomer and/or the siloxane prepolymer.

In view of storage stability, it is preferable that the by-products (for example, alcohols or water) and the catalyst are not contained in polysiloxane produced after hydrolysis and partial condensation. Therefore, it is preferable to purify polysiloxane. There is no specific limitation to the purification method. Preferably, polysiloxane is diluted with a hydrophobic solvent, and the organic layer washed with water several times is then concentrated with an evaporator to remove alcohols and water. Additionally, the catalyst can be removed using ion exchange resin.

O-Naphthoquinonediazidesulfonic Acid Ester:

There is no specific limitation to the o-naphthoquinonediazidesulfonic acid ester suitable in the photosensitive polysiloxane composition of the present invention. The o-naphthoquinonediazidesulfonic acid ester can be a fully or partially esterified compound.

Preferably, the o-naphthoquinonediazidesulfonic acid ester is obtained via a reaction of o-naphthoquinonediazidesulfonic acid or salt thereof with a hydroxyl compound. More preferably, the o-naphthoquinonediazidesulfonic acid ester is obtained via a reaction of o-naphthoquinonediazidesulfonic acid or salt thereof with a polyhydroxyl compound.

Examples of the o-naphthoquinonediazidesulfonic acid include, but are not limited to, o-naphthoquinonediazide-4-sulfonic acid, o-naphthoquinonediazide-5-sulfonic acid, and o-naphthoquinonediazide-6-sulfonic acid. A non-limiting example of the salt of o-naphthoquinonediazidesulfonic acid is halide of o-naphthoquinonediazidesulfonic acid.

Examples of the hydroxyl compound include, but are not limited to:

(1) hydroxybenzophenone compounds, for example, but not limited to, 2,3,4-trihydroxybenzophenone, 2,4,4'-trihydroxybenzophenone, 2,4,6-trihydroxybenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,5,3',5'-pentahydroxybenzophenone, and 2,3,4,3',4',5'-hexahydroxybenzophenone.

(2) hydroxyaryl compounds, for example, but not limited to, a hydroxyaryl compound represented by Formula (a):

(a)

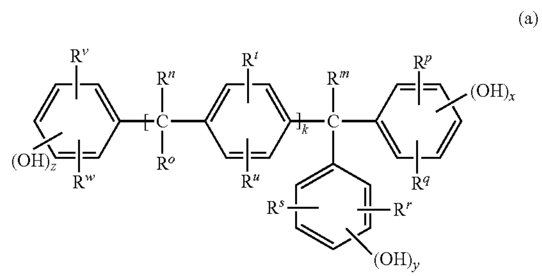

where $R^m$, $R^n$, and $R^o$ independently represent a hydrogen atom or a $C_1$-$C_6$ alkyl group;

$R^p$, $R^q$, $R^r$, $R^s$, $R^t$, and $R^u$ independently represent a hydrogen atom, a halogen atom, a $C_1$-$C_6$ alkyl group, a $C_1$-$C_6$ alkoxy group, a $C_1$-$C_6$ alkenyl group, or a cycloalkyl group;

$R^v$ and $R^w$ independently represent a hydrogen atom, a halogen atom, or a $C_1$-$C_6$ alkyl group;

x, y, and z independently denote an integer ranging from 1 to 3; and k is 0 or 1.

Examples of the hydroxyaryl compound represented by Formula (a) include, but are not limited to, tri(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6- hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene.

(3) (hydroxyphenyl)hydrocarbon compounds, for example, but not limited to, a (hydroxyphenyl)hydrocarbon compound represented by Formula (b):

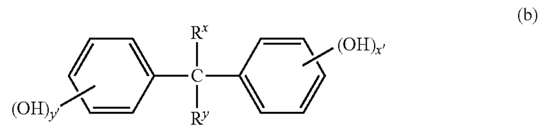

where $R^x$ and $R^y$ independently represent a hydrogen atom or a $C_1$-$C_6$ alkyl group; and x' and y' independently represent an integer ranging from 1 to 3.

Examples of the (hydroxyphenyl)hydrocarbon compound represented by Formula (b) include, but are not limited to, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane, and bis(2,4-dihydroxyphenyl)methane.

(4) other aromatic hydroxyl compounds, for example, but not limited to, phenol, p-methoxyphenol, dimethylphenol, hydroquinone, bisphenol A, naphthol, pyrocatechol, pyrogallol monomethyl ether, pyrogallol-1,3-dimethyl ether, gallic acid, partially esterified or partially etherified gallic acid, or the like.

The aforesaid examples of the hydroxyl compounds can be used alone or as a mixture of two or more.

Preferably, the hydroxyl compound is selected from 1-[1-(4-hydroxyphenyl)isopropyl]-4-[1,1-bis(4-hydroxyphenyl)ethyl]benzene, 2,3,4-trihydroxybenzophenone, 2,3,4,4'-tetrahydroxybenzophenone, and combinations thereof.

The reaction of o-naphthoquinonediazidesulfonic acid or salt thereof with the hydroxyl compound is often conducted in an organic solvent such as dioxane, N-pyrrolidone, acetamide, and the like, in the presence of an alkali condensation agent such as triethanolamine, alkali carbonate, alkali hydrogen carbonate, and the like.

Preferably, the esterification rate of the o-naphthoquinonediazidesulfonic acid ester is more than 50%. That is, more than 50% by mole of the hydroxyl group contained in the hydroxyl compound undergoes an esterification reaction with o-naphthoquinonediazidesulfonic acid or salt thereof based on 100% by mole of the total hydroxyl group contained in the hydroxyl compound. More preferably, the esterification rate of the o-naphthoquinonediazidesulfonic acid ester is more than 60%.

The o-naphthoquinonediazidesulfonic acid ester is used in an amount ranging from 1 part by weight to 50 parts by weight, preferably from 2 parts by weight to 40 parts by weight, and more preferably from 3 parts by weight to 30 parts by weight based on 100 parts by weight of the polysiloxane.

Urethane (Meth)Acrylate Compound Having at Least Six (Meth)Acryloyl Groups in a Molecule:

When the urethane (meth)acrylate compound having at least six (meth)acryloyl groups in a molecule is not included in the photosensitive polysiloxane composition, the protective film formed from the photosensitive polysiloxane composition has inferior sensitivity.

The urethane (meth)acrylate compound having at least six (meth)acryloyl groups in a molecule can be prepared by known methods. A non-limiting exemplary method for producing the urethane (meth)acrylate compound includes steps of reacting a polyol compound with a polyisocyanate compound, followed by further reacting with a hydroxyl-containing (meth)acrylate compound so as to obtain the urethane (meth)acrylate compound. Alternatively, the urethane (meth)acrylate compound can be obtained by reacting the hydroxyl-containing (meth)acrylate compound with the polyisocyanate compound, followed by further reacting with the polyol compound.

Preferably, the urethane (meth)acrylate compound is prepared by reacting a di-functional polyol compound with a di-functional polyisocyanate compound, followed by further reacting with pentaerythritol tri(meth)acrylate. More preferably, such reaction is conducted in the presence of a catalyst. Examples of the catalyst include, but are not limited to, di-n-butyltin dilaurate and other conventional catalysts for esterification of urethane.

Examples of the hydroxyl-containing (meth)acrylate compound include, but are not limited to, 2-hydroxyethyl(meth)acrylate, hydroxymethyl (meth)acrylate, 2-hydroxypropyl (meth)acrylate, glycidol di(meth)acrylate, triglycerol di(meth)acrylate, pentaerythritol tri(meth)acrylate, dipentaerythritol penta(meth)acrylate, dipentaerythritol tetra(meth)acrylate, dipentaerythritol tri(meth)acrylate, dipentaerythritol di(meth)acrylate, trimethylolpropane di(meth)acrylate, and epoxy acrylate. The aforesaid examples of the hydroxyl-containing (meth)acrylate compound can be used alone or as a mixture of two or more. Preferably, the hydroxyl-containing (meth)acrylate compound is pentaerythritol tri(meth)acrylate.

Preferably, the polyisocyanate compound has at least two isocyanate groups in a molecule. Examples of the polyisocyanate compound include, but are not limited to, tolylene diisocyanate, diphenylmethane diisocyanate, polymethylene polyphenyl polyisocyanate, toluidine diisocyanate, naphthalene diisocyanate, hexamethylene diisocyanate, isophorone diisocyanate, xylylene diisocyanate, hydrogenated xylylene diisocyanate, and dicyclohexylmethane diisocyanate. The aforementioned examples of the polyisocyanate compound may be used alone or in a mixture of two or more.

Preferably, examples of the polyol compound include, but are not limited to, poly(propylene oxide) diol, poly(propylene oxide) triol, copoly(ethylene oxide-propylene oxide) diol, poly(tetramethylene oxide) glycol, ethoxylated bisphenol A, ethoxylated bisphenol S, spiro glycol, caprolactone-modified diol, carbonate diol, trimethylolpropane, and pentaerythritol. The aforementioned examples of the polyol compound may be used alone or in a mixture of two or more.

Preferably, the molecular weight of the urethane (meth)acrylate compound having at least six (meth)acryloyl groups in a molecule ranges from 1,000 to 200,000, more preferably from 1,200 to 100,000, even more preferably from 1,500 to 50,000.

The urethane (meth)acrylate compound has preferably at least seven (meth)acryloyl groups in a molecule, and more preferably at least eight (meth)acryloyl groups in a molecule so as to further enhance the sensitivity of the protective film thus formed.

Commercially available products of the urethane (meth)acrylate compound having at least six (meth)acryloyl groups in a molecule may include, but are not limited to:

(1) urethane (meth)acrylate compound having six (meth) acryloyl groups in a molecule: Shiko UV-7600B and Shiko UV-7605B available from Nippon Synthetic Chemical Industry Co., Ltd.; Art Resin UN-3320HA and Art Resin UN-3320HC available from Negami Industry Co., Ltd.; NK Oligo U-6HA and NK Oligo U-6LPA available from Shin-Nakamura Chemical Industry Co., Ltd.; EBECRYL 5129, EBECRYL 220, EBECRYL 8301, KRM 8200, and KRM 8200AE available from Daicel-Cytec Co., Ltd.; and Beam Set 575 and Beam Set 577 available from Toagosei Co., Ltd., (2) urethane (meth)acrylate compound having seven (meth) acryloyl groups in a molecule: Shiko UV-6300B available from Nippon Synthetic Chemical Industry Co., Ltd., and (3) urethane (meth)acrylate compound having eight (meth) acryloyl groups in a molecule: Shiko UV-7610B, Shiko UV-7620EA, and Shiko UV-1700B available from Nippon Synthetic Chemical Industry Co., Ltd.; Art Resin UN-901T and Art Resin UN-3320HS available from Negami Industry Co., Ltd.); NK Oligo UA-33H and NK Oligo UA-53H available from Shin-Nakamura Chemical Industry Co., Ltd.; and KRM 8452 available from Daicel-Cytec Co., Ltd.

The aforementioned commercially available examples of the urethane (meth)acrylate compound can be used alone or in a mixture of two or more. The preferable commercially available products are Shiko UV-1700B, Shiko UV-6300B, and Shiko UV-7605B available from Nippon Synthetic Chemical Industry Co., Ltd.; NK Oligo U-6HA available from Shin-Nakamura Chemical Industry Co., Ltd.; and Art Resin UN-3320HC, Art Resin UN-3320HS and Art Resin UN-901T available from Negami Industry Co., Ltd.

The urethane (meth)acrylate compound having at least six (meth)acryloyl groups in a molecule is used in a range generally from 0.1 to 35 parts by weight, preferably from 0.5 to 30 parts by weight, and more preferably from 1 to 25 parts by weight based on 100 parts by weight of the polysiloxane.

Solvent:

There is no specific limitation to the solvent suitable in the photosensitive polysiloxane composition of the present invention. Examples of the solvent include, but are not limited to, an alcoholic hydroxyl-containing compound, and a carbonyl-containing cyclic compound. The aforesaid examples of the solvent can be used alone or as a mixture of two or more.

Examples of the alcoholic hydroxyl-containing compound include, but are not limited to, acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol, abbreviated as DAA), ethyl lactate, butyl lactate, propylene glycol monomethyl ether, propylene glycol monoethyl ether (abbreviated as PGEE), propylene glycol monomethylether acetate (abbreviated as PGMEA), propylene glycol mono-n-propyl ether, propylene glycol mono-n-butyl ether, propylene glycol mono-t-butyl ether, 3-methoxy-1-butanol, 3-methyl-3-methoxy-1-butanol, and combinations thereof. The aforesaid examples of the alcoholic hydroxyl-containing compound can be used alone or as a mixture of two or more.

Preferably, the alcoholic hydroxyl-containing compound is selected from diacetone alcohol, ethyl lactate, propylene glycol monoethyl ether, propylene glycol monomethylether acetate, and combinations thereof.

Examples of the carbonyl-containing cyclic compound include, but are not limited to, γ-butyrolactone, γ-valerolactone, δ-valerolactone, propylene carbonate, N-methylpyrrolidone, cyclohexanone, and cycloheptanone. The aforesaid examples of the carbonyl-containing cyclic compound can be used alone or as a mixture of two or more.

Preferably, the carbonyl-containing cyclic compound is selected from γ-butyrolactone, N-methylpyrrolidone, cyclohexanone, and combinations thereof.

When the alcoholic hydroxyl-containing compound and the carbonyl-containing cyclic compound are used in combination, there is no specific limitation to the weight ratio thereof. The weight ratio of the alcoholic hydroxyl-containing compound to the carbonyl-containing cyclic compound ranges preferably from 99/1 to 50/50, and more preferably from 95/5 to 60/40. It should be noted that, when the weight ratio of the alcoholic hydroxyl-containing compound to the carbonyl-containing cyclic compound ranges from 99/1 to 50/50, it is less likely for the unreactive silanol group in the polysiloxane to undergo condensation reaction that may reduce the storage stability. Moreover, the miscibility between the polysiloxane and the o-naphthoquinonediazidesulfonic acid ester is good so that it is less likely to opaque the protective film, thereby maintaining the transparency of the protective film.

Further solvents other than the aforesaid solvent can be included in the photosensitive polysiloxane composition of the present invention as long as the desirable effects obtainable by the photosensitive polysiloxane composition are not impaired. Examples of the further solvents include, but are not limited to: (1) esters, for example, ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate, and the like; (2) ketones, for example, methyl isobutyl ketone, diisopropyl ketone, diisobutyl ketone, and the like; (3) ethers, for example, diethyl ether, diisopropyl ether, di-n-butyl ether, diphenyl ether, and the like.

The solvent is used in an amount ranging generally from 50 parts by weight to 1,200 parts by weight, preferably from 80 parts by weight to 1,000 parts by weight, and more preferably from 100 parts by weight to 800 parts by weight based on 100 parts by weight of the polysiloxane.

Additives:

Additives can be optionally added to the photosensitive polysiloxane composition, and include, but are not limited to, a sensitizer, an adhesion auxiliary agent, a surfactant, a solubility promoter, a defoamer, and combinations thereof.

There is no specific limitation to the sensitizer. Preferably, the sensitizer is a phenolic hydroxyl-containing compound, for example, but not limited to:

(1) trisphenol type compounds, for example, tri(4-hydroxyphenyl)methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenyl methane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenyl methane, bis(4-hydroxyphenyl)-3-methoxy-4-hydroxyphenylmethane, bis(5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3,4-dihydroxyphenylmethane, and the like;

(2) bisphenol type compounds, for example, bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, 2-(2,3,4-trihydroxyphenyl)-2-(4'-hydroxy-3',5'-dimethylphenyl)propane, and the like;
(3) polynuclear branched compounds, for example, 1-[1-(4-hydroxyphenyl)isopropyl]-4-[1,1-bis(4-hydroxyphenyl)ethyl]benzene, 1-[1-(3-methyl-4-hydroxyphenyl]isopropyl]-4-[1,1-bis(3-methyl-4-hydroxyphenyl)ethyl]benzene, and the like;
(4) condensation type phenol compounds, for example, 1,1-bis(4-hydroxyphenyl)cyclohexane, and the like;
(5) polyhydroxy benzophenones, for example, 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,4,2',4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone, 2,3,4,3',4',5'-hexahydroxybenzophenone, and the like; and
(6) combinations thereof.

The sensitizer is used in an amount ranging preferably from 5 to 50 parts by weight, more preferably from 8 to 45 parts by weight, and most preferably from 10 to 40 parts by weight based on 100 parts by weight of the polysiloxane.

The adhesion auxiliary agent is used to enhance the adhesion of the photosensitive polysiloxane composition of the present invention to a substrate containing a semiconductor material. Examples of the adhesion auxiliary agent include, but are not limited to, melamine compounds and silane compounds. Examples of the commercially available products of the melamine compounds include, but are not limited to, Cymel-300, Cymel-303, and the like manufactured by Mitsui Chemicals; and MW-30MH, MW-30, MS-11, MS-001, MX-750, MX-706, and the like manufactured by Sanwa Chemical. Examples of the silane compounds include, but are not limited to, vinyltrimethoxysilane, vinyltriethoxysilane, 3-(meth)acryloxypropyltrimethoxysilane, vinyltri(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropyldimethylmethoxysilane, 2-(3,4-epoxycyclohexyl)ethyltrimethoxysilane, 3-chloropropylmethyldimethoxysilane, 3-chloropropyltrimethoxysilane, 3-methylallyloxypropyltrimethoxysilane, 3-mercaptopropyltrimethoxysilane, and commercially available products manufactured by Shin-Etsu Chemical Co., Ltd. (for example, KMB403).

The melamine compounds used as the adhesion auxiliary agent are in an amount ranging preferably from 0 to 20 parts by weight, more preferably from 0.5 part by weight to 18 parts by weight, and most preferably from 1.0 part by weight to 15 parts by weight based on 100 parts by weight of the polysiloxane.

The silane compounds used as the adhesion auxiliary agent are in an amount ranging preferably from 0 to 2 parts by weight, more preferably from 0.05 part by weight to 1.5 part by weight, and most preferably from 0.1 part by weight to 1 part by weight based on 100 parts by weight of the polysiloxane.

Examples of the surfactant include, but are not limited to, anionic surfactant, cationic surfactant, nonionic surfactant, amphoteric surfactant, polysiloxane surfactant, fluorinated surfactant, and combinations thereof. Examples of the surfactant include, but are not limited to: (1) polyoxyethylene alkyl ethers, for example, polyoxyethylene lauryl ether, and the like; (2) polyoxyethylene alkyl phenyl ethers, for example, polyoxyethylene octyl phenyl ether, polyoxyethylene nonyl phenyl ether, and the like; (3) polyethylene glycol diesters, for example, polyethylene glycol dilaurate, polyethylene glycol distearate, and the like; (4) sorbitan fatty acid esters; (5) fatty acid modified polyesters; and (6) tertiary amine modified polyurethanes, and the like. Examples of commercially available products of the surfactant include KP (manufacture by Shin-Etsu Chemical Co., Ltd.), SF-8427 (manufactured by Toray Dow Corning Silicone), Polyflow (manufactured by Kyoeisha Chemical Co., Ltd.), F-Top (manufactured by Tochem Product Co., Ltd.), Megaface (manufactured by DIC), Fluorade (manufactured by Sumitomo 3M), Surflon (manufactured by Asahi Glass), SINOPOL E8008 (manufactured by Sino-Japan Chemical Co., Ltd.), F-475 (manufactured by DIC), and combinations thereof.

The surfactant is used in an amount ranging from 0.5 part by weight to 50 parts by weight, preferably from 1 part by weight to 40 parts by weight, and more preferably from 3 parts by weight to 30 parts by weight based on 100 parts by weight of the polysiloxane.

Examples of the defoamer include, but are not limited to, Surfynol MD-20, Surfynol MD-30, EnviroGem AD01, EnviroGem AE01, EnviroGem AE02, Surfynol DF 110D, Surfynol 104E, Surfynol 420, Surfynol DF 37, Surfynol DF 58, Surfynol DF 66, Surfynol DF 70, and Surfynol DF 210 (manufactured by Air products).

The defoamer is used in an amount ranging preferably from 1 part to 10 parts by weight, more preferably from 2 parts to 9 parts by weight, and most preferably from 3 parts to 8 parts by weight based on 100 parts by weight of the polysiloxane.

Examples of the solubility promoter include, but are not limited to, N-hydroxydicarboxylic imide compounds, and phenolic hydroxyl compounds, for example, the hydroxyl compounds used for manufacturing the o-naphthoquinonediazidesulfonic acid ester.

The solubility promoter is used in an amount ranging preferably from 1 part by weight to 20 parts by weight, more preferably from 2 parts by weight to 15 parts by weight, and most preferably from 3 parts by weight to 10 parts by weight based on 100 parts by weight of the polysiloxane.

The photosensitive polysiloxane composition of the present invention is manufactured by stirring the polysiloxane, the o-naphthoquinonediazidesulfonic acid ester, the urethane (meth)acrylate compound having at least six (meth)acryloyl groups in a molecule, the solvent, and the optional additives in a stirrer to form a homogeneous solution.

A protective film of the present invention is formed by coating the photosensitive polysiloxane composition onto a substrate followed by pre-bake, exposure, development, and post-bake treatments.

The photosensitive polysiloxane composition is applied on the substrate by spin coating, slit coating, roller coating, or the like, and is then prebaked to remove the solvent and to form a prebaked coating film. The conditions for the prebaking depend on the types and the formulating ratio of the components for the photosensitive polysiloxane composition. However, the prebaking is usually conducted at a temperature ranging from 70° C. to 110° C. for a period ranging from 1 minute to 15 minutes. The prebaked coating film is exposed via a photomask using ultraviolet light, such as g-line, h-line, i-line, or the like. The device for providing the ultraviolet light includes a (ultra-) high pressure mercury lamp, and a metal halide lamp. The prebaked coating film after exposing is immersed in a developer solution at a temperature of 23±2° C. for a period ranging from 15 seconds to 5 minutes so as to form a desired pattern. Examples of the developer include alkali compounds, such as sodium hydroxide, potassium hydroxide, sodium carbonate, sodium hydrogen carbonate, potassium carbonate, potassium hydrogen carbonate, sodium silicate, sodium methylsilicate, aqueous ammonia, ethylamine, diethylamine, dimethyl ethanolamine, tetramethylammonium hydroxide (THAM), tetraethylammonium hydroxide, choline, pyrrole, piperidine, 1,8-diazabicyclo-[5,4,0]-7-undecene, and the like.

The developer solution is used to reveal defined patterns after exposing the photosensitive polysiloxane composition. When the concentration of the developer solution is too high, the specific patterns will be damaged or have deteriorated resolution. When the concentration of the developer solution is too low, the specific patterns will not be formed or residue after developing may be formed due to poor development. The concentration of the developer solution will influence the patterns formed by the photosensitive polysiloxane composition after exposure. Preferably, the developer solution is used in a concentration ranging preferably from 0.001 wt % to 10 wt %, more preferably from 0.005 wt % to 5 wt %, and even more preferably from 0.01 wt % to 1 wt %.

In the illustrative examples of this invention, 2.38 wt % of tetramethylammonium hydroxide was used as the developer solution. The developer solution of 2.38 wt % is commonly used in the art while the developer solution less than 2.38 wt % can be used, if required. The developer solution of 2.38% can be used for developing the photosensitive polysiloxane composition in this invention. The photosensitive polysiloxane composition is capable of forming fine patterns even when a developer solution less than 2.38 wt % is used.

The developer solution is removed by washing with water after developing. The coating film formed on the substrate is dried with compressed air or nitrogen, and is then post-baked using a heating device, such as a hot plate or an oven. The post-baking is conducted at a temperature ranging from 100° C. to 250° C. for a period ranging from 1 minute to 60 minutes if the hot plate is used or for a period ranging from 5 minutes to 90 minutes if the oven is used. A protective film is formed on the substrate after the process mentioned above.

Examples of the substrate suitable for the present invention include alkali-free glass, soda-lime glass, Pyrex glass, quartz glass, a glass coated with a transparent conductive film thereon, and the like commonly used in a liquid crystal display; and a photoelectric conversion substrate (for example, a silicon substrate) used in a solid-state image sensor.

An element including the substrate and the protective film formed from the photosensitive polysiloxane composition of the present invention applied on the substrate can be used in a display device, a semiconductor device, an optical waveguide device, and the like.

The following examples are provided to illustrate the preferred embodiments of the invention, and should not be construed as limiting the scope of the invention.

EXAMPLES

Preparation of Polysiloxane

Preparation Example A-1

A 500 ml three-necked flask was added with methyltrimethoxysilane (referred to as MTMS, 0.3 mole), phenyltrimethoxysilane (referred to as PTMS, 0.65 mole), 3-(triethoxysilyl)propylsuccinic anhydride (referred to as GF-20, 0.05 mole), and propylene glycol monoethyl ether (referred to as PGEE, 200 g). Stirring was conducted at room temperature while an aqueous oxalic acid solution (0.40 g oxalic acid/75 g $H_2O$) was added over 30 minutes. The mixture in the flask was then stirred in an oil bath at a temperature of 30° C. for 30 minutes. The temperature of the oil bath was raised to 120° C. within a succeeding 30 minutes. When the temperature of the mixture in the flask reached 105° C., the mixture in the flask was stirred for a further 6 hours to carry out polycondensation reaction. Polysiloxane (A-1) was obtained after distillation to remove the solvent.

Preparation Examples A-2 to A-4

Preparation Examples A-2 to A-4 were conducted in a manner identical to that of Preparation Example 1 using the components and the amounts thereof and the reaction conditions listed in Table 1.

TABLE 1

| | Polysiloxane | | | | | | | | | | | | | |
|---|---|---|---|---|---|---|---|---|---|---|---|---|---|---|
| | | | | | | | | | | | Catalysts (g) | | React. | Polycon. |
| Pre. | Silane Monomer/Siloxane Prepolymer (mole) | | | | | | | | Solvents (g) | | | Oxalic | Temp. | Time |
| Ex. | MTMS | DMDMS | PTMS | PTES | GF-20 | TMSG | TMSOX-D | DMS-S27 | PGEE | DAA | Water | Acid | (° C.) | (hrs) |
| A-1 | 0.30 | — | 0.65 | — | 0.05 | — | — | — | 200 | — | 75 | 0.40 | 105 | 6 |
| A-2 | — | 0.40 | 0.40 | 0.20 | — | — | — | — | 100 | 100 | 75 | 0.40 | 110 | 5 |
| A-3 | — | 0.60 | 0.35 | — | — | 0.05 | — | — | 200 | — | 75 | 0.35 | 105 | 6 |
| A-4 | 0.65 | — | — | 0.25 | — | — | 0.09 | 0.01 | 200 | — | 75 | 0.45 | 110 | 6 |

| Abbreviation | Chemicals | Molecular Weight (Mw) |
|---|---|---|
| MTMS | methyltrimethoxysilane | 136 |
| DMDMS | dimethyldimethoxysilane | 120 |
| PTMS | phenyltrimethoxysilane | 198 |
| PTES | phenyltriethoxysilane | 240 |
| GF-20 | 3-( triethoxysilyl)propylsuccinic anhydride | 304 |
| TMSG | 3-(trimethoxysilyl)propylglutaric anhydride | 276 |
| TMSOX-D | 3-ethyl-3-[[3-(trimethoxysilyl)propoxy)methyl]oxetane | 278 |
| DMS-S27 | silanol terminal polysiloxane manufactured by Gelest Inc. | 18000 |
| PGEE | propylene glycol monoethyl ether | 104 |
| DAA | diacetone alcohol | 116 |

Preparation of Photosensitive Polysiloxane Composition

Example 1

100 parts by weight of the polysiloxane (A-1) obtained in Preparation Example A-1, 3 parts by weight of an o-naphthoquinonediazidesulfonic acid ester (DPAP200 manufactured by DKC, average esterification rate: 67%) obtained by reacting 1-[1-(4-hydroxyphenyl)isopropyl]-4-[1,1-bis(4-hydroxyphenypethyl]benzene with o-naphthoquinonediazo-5-sulfonic acid, and 0.1 part by weight of U-6HA were added into 50 parts by weight of propylene glycol monomethylether acetate (referred to as PGMEA). Stirring was conducted using a shaking type stirrer until a homogenous photosensitive polysiloxane composition was obtained. The obtained photosensitive polysiloxane composition was evaluated according to the following evaluation method. The evaluation result is shown in Table 2.

Examples 2 to 8 and Comparative Examples 1 to 3

Examples 2 to 8 and Comparative Examples 1 to 3 were conducted in a manner identical to that of Example 1 using the components and the amounts thereof listed in Table 2. The obtained photosensitive polysiloxane compositions of Examples 2 to 8 and Comparative Examples 1 to 3 were evaluated according to the following evaluation method. The evaluation results are shown in Table 2.

Evaluation Method:

Sensitivity:

The photosensitive polysiloxane compositions obtained in Examples 1 to 8 and Comparative Examples 1 to 3 were separately spin-coated on glass substrates of 100 mm×100 mm×0.7 $mm^3$ to obtain pre-coated films of 2 μm in thickness followed by pre-bake at 110° C. for 2 minutes. The pre-coated films were treated with ultra-violet irradiation using an exposure machine through a photo-mask for positive photoresist, and were then immersed in a developer solution of 2.38 wt % tetramethylammonium hydroxide solution for 60 seconds. The evaluation was conducted by determining the exposure energy (mJ) required for forming a pattern of a coating film with a linewidth of 1 μm.

◎: exposure energy<100 $mJ/cm^2$;

○: 100 $mJ/cm^2$≤exposure energy<200 $mJ/cm^2$;

X: 200 $mJ/cm^2$≤exposure energy.

TABLE 2

| Components (Parts by weight) | | Examples 1 | 2 | 3 | 4 | 5 | 6 | 7 | 8 | Comparative Examples 1 | 2 | 3 |
|---|---|---|---|---|---|---|---|---|---|---|---|---|
| Polysiloxane | A-1 | 100 | — | — | — | — | — | 70 | — | 100 | — | — |
| | A-2 | — | 100 | — | — | — | 100 | 30 | 30 | — | 100 | — |
| | A-3 | — | — | 100 | — | 100 | — | — | — | — | — | 100 |
| | A-4 | — | — | — | 100 | — | — | — | 70 | — | — | — |
| o-naphthoqumonediazide-sulfonic acid ester | B-1 | 3 | 10 | 10 | 20 | — | 20 | 30 | 40 | 20 | 5 | 30 |
| | B-2 | — | — | 5 | — | 20 | 10 | 20 | — | — | 20 | — |
| Urethane (meth)acrylate compound having at least six (meth)acryloyl groups in a molecule | C-1 | 0.1 | — | — | 5 | — | — | 30 | — | — | — | — |
| | C-2 | — | — | — | — | 10 | — | — | 25 | — | — | — |
| | C-3 | — | — | 10 | — | 10 | — | — | — | — | — | — |
| | C-4 | — | 5 | — | — | — | 25 | — | — | — | — | — |
| | C-5 | — | — | — | 10 | — | — | — | 10 | — | — | — |
| Urethane (meth)acrylate compound having two (meth)acryloyl groups in a molecule | C-6 | — | — | — | — | — | — | — | — | — | — | 10 |
| Solvent | D-1 | 50 | — | 300 | 500 | 300 | 600 | 500 | — | 600 | 600 | — |
| | D-2 | — | 300 | 100 | — | — | — | — | 600 | — | — | 800 |
| | D-3 | — | — | — | — | 200 | — | 300 | — | — | — | — |
| Additives | E-1, surfactant | — | — | — | — | 0.5 | — | — | — | — | — | — |
| | E-2, adhesion auxiliary agent | — | — | 1 | — | — | — | 2 | — | — | — | — |
| Evaluation Item | | ○ | ◎ | ◎ | ◎ | ◎ | ◎ | ○ | ◎ | X | X | X |

B-1: o-naphthoquinonediazidesulfonic acid ester obtained by reacting 1-[1-(4-hydroxyphenyl)isopropyl]-4-[1,1-bis(4-hydroxyphenyl)ethyl]benzene with o-naphthoquinonediazo-5-sulfonic acid;
B-2: o-naphthoquinonediazidesulfonic acid ester obtained by reacting 2,3,4-trihydroxybenzophenone with o-naphthoquinonediazo-5-sulfonic acid;
C-1: U-6HA manufactured by Shin Nakamura Chemical Co., Ltd.;
C-2: UV-1700B manufactured by Nippon Synthetic Chemical Industry Co., Ltd.;
C-3: UV-6300B manufactured by Nippon Synthetic Chemical Industry Co., Ltd.;
C-4: UN-901T manufactured by Negami Industry Co.;
C-5: UN-3320HS manufactured by Negami Industry Co.;
C-6: UN-9000PEP manufactured by Negami Industry Co.;
D-1: propylene glycol monomethylether acetate (PGMEA);
D-2: diacetone alcohol (DAA);
D-3: cyclohexanone;
E-1: SF-8427 manufactured by Toray Dow Corning Silicone;
E-2: 3-glycidoxypropyltrimethoxysilane (KBM403 manufactured by Shin-Etsu Chemical Co., Ltd.)

As shown in Table 2, the photosensitive polysiloxane composition in Comparative Example 1 includes the polysiloxane (A-1) having acid value, and the photosensitive polysiloxane composition in Comparative Example 2 includes the polysiloxane (A-2) having no acid value. Both of the photosensitive polysiloxane compositions are not added with the urethane (meth)acrylate compound having at least six (meth)acryloyl groups in a molecule, and the protective films formed therefrom have inferior sensitivity. The photosensitive polysiloxane composition in Comparative Example 3 includes the urethane (meth)acrylate compound having only two (meth) acryloyl groups in a molecule, and the protective film formed therefrom has inferior sensitivity.

All of the photosensitive polysiloxane compositions in Examples 1 to 8 include the urethane (meth)acrylate compound having at least six (meth)acryloyl groups in a molecule, and all of the protective films formed therefrom have superior sensitivity regardless of whether the polysiloxanes contained in the photosensitive polysiloxane compositions have acid value or not. Specifically, the photosensitive polysiloxane compositions in Examples 2 to 6 and 8 include the urethane (meth)acrylate compound having at least seven (meth)acryloyl groups in a molecule, and the protective films formed therefrom have even better sensitivity.

In view of the aforesaid, in the photosensitive polysiloxane composition of the present invention, the urethane (meth) acrylate compound having at least six (meth)acryloyl groups in a molecule is included therein, and a protective film with superior sensitivity can be formed from the photosensitive polysiloxane composition.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A photosensitive polysiloxane composition, comprising:
a polysiloxane,
an o-naphthoquinonediazidesulfonic acid ester,
a urethane (meth)acrylate compound having at least six (meth)acryloyl groups in a molecule, and
a solvent.

2. The photosensitive polysiloxane composition according to claim 1, wherein said urethane (meth)acrylate compound has at least seven (meth)acryloyl groups in a molecule.

3. The photosensitive polysiloxane composition according to claim 2, wherein said urethane (meth)acrylate compound has at least eight (meth)acryloyl groups in a molecule.

4. The photosensitive polysiloxane composition according to claim 1, wherein said o-naphthoquinonediazidesulfonic acid ester is in an amount ranging from 1 to 50 parts by weight, said urethane (meth)acrylate compound is in an amount ranging from 0.1 to 35 parts by weight, and said solvent is in an amount ranging from 50 to 1200 parts by weight based on 100 parts by weight of said polysiloxane.

5. The photosensitive polysiloxane composition according to claim 1, wherein said polysiloxane is obtained by subjecting a silane monomer of formula (I) to condensation:

$$Si(R^a)_t(OR^b)_{4-t} \quad (I)$$

where t denotes an integer ranging from 0 to 3, $R^a$ independently represents hydrogen, a $C_1$-$C_{10}$ alkyl group, a $C_2$-$C_{10}$ alkenyl group, a $C_6$-$C_{15}$ aryl group, an anhydride-substituted $C_1$-$C_{10}$ alkyl group, an epoxy-substituted $C_1$-$C_{10}$ alkyl group, or an epoxy-substituted oxyalkyl group, and $R^b$ independently represents hydrogen, a $C_1$-$C_6$ alkyl group, a $C_1$-$C_6$ acyl group, or a $C_6$-$C_{15}$ aryl group.

6. A protective film adapted to be formed on a substrate, said protective film being formed by applying the photosensitive polysiloxane composition according to claim 1 on the substrate.

7. An element comprising a substrate and the protective film according to claim 6 applied on said substrate.

* * * * *